US006703948B1

(12) United States Patent
Kupferschmidt et al.

(10) Patent No.: US 6,703,948 B1
(45) Date of Patent: Mar. 9, 2004

(54) METHOD FOR DECODING DIGITAL AUDIO DATA

(75) Inventors: Claus Kupferschmidt, Wedemark (DE); Volker Schade-Bunsow, Hildesheim (DE); Torsten Mlasko, Hildesheim (DE); Marc Klein Middelink, Huissen (NL)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/149,519

(22) PCT Filed: Nov. 7, 2000

(86) PCT No.: PCT/DE00/03895

§ 371 (c)(1), (2), (4) Date: Oct. 24, 2002

(87) PCT Pub. No.: WO01/43120

PCT Pub. Date: Jun. 14, 2001

(30) Foreign Application Priority Data

Dec. 8, 1999 (DE) ........................................ 199 59 037

(51) Int. Cl.[7] ................................................ H03M 7/00
(52) U.S. Cl. ........................................................ 341/50
(58) Field of Search ........................... 370/332; 341/50, 341/94; 381/94.5

(56) References Cited

U.S. PATENT DOCUMENTS 4,943,964 A * 7/1990 Hatanaka et al. ........... 714/747
5,148,487 A * 9/1992 Nagai et al. ................ 704/265
5,301,255 A * 4/1994 Nagai et al. ................ 704/230
5,333,148 A * 7/1994 Tsubaki et al. ............. 375/229
5,420,884 A * 5/1995 Inoue ......................... 375/229
5,450,081 A 9/1995 Kuhn et al. ................... 341/94
5,673,363 A * 9/1997 Jeon et al. .................. 704/270
5,920,833 A * 7/1999 Dierke ....................... 704/230
5,974,584 A * 10/1999 Hendrickson et al. ...... 714/800

FOREIGN PATENT DOCUMENTS

DE 42 02 140 7/1993 ............ H04B/1/66
DE 44 09 960 9/1995 ............ H04B/1/10
EP 0 718 982 6/1996 ............ H04B/1/66

OTHER PUBLICATIONS

D. Wiese, "Optimization of Error Detection and Concealment for ISO/MPEG/AUDIO CODECs Layer I and II," 93$^{rd}$ AES Convention, No. 3368, 1992, pp. 1–18.
Plenge et al. "Combined Channel Coding and Concealment," IEE Colloquium on Terrestrial DAB, Where is it Going?, Feb. 17, 1993, pp. 3-1–3-8.
C. Weck, "Der Bitfehlerschutz BEI DAB" Rundfunktechnische, vol. 40, No. 1, Mar. 1, 1996, pp. 1–6.
G. Stoll "EU477 DAB: High Quality Audio Due to a Combined Concept of Source, Channel Coding and Concealment", Vortrage der ITG–Fachtagung, Oct. 26–28, 1994, vol. NR. 130, 1994, pp. 233–241.
Patent Abstracts of Japan, vol. 018, no 152 (E–1523), Mar. 14, 1994 (JP 05 328 290, Dec. 10, 1993, abstract).

* cited by examiner

*Primary Examiner*—Peguy JeanPierre
(74) *Attorney, Agent, or Firm*—Kenyon & Kenyon

(57) ABSTRACT

A method of decoding digital audio data is described; it is used to implement error concealment as a function of an error count in which the preceding data is also taken into account. Therefore, equalizer values, through which dequantization of the received digital audio data is implemented, are determined. The equalizer values are either stored or computed. If the error count is greater than a predetermined highest threshold value, a muting is activated. If the error count is less than the lowest predetermined threshold value, no equalizer values are used for dequantization.

18 Claims, 1 Drawing Sheet

METHOD FOR DECODING DIGITAL AUDIO DATA

FIELD OF THE INVENTION

The present invention relates to a method of decoding digital audio data.

BACKGROUND INFORMATION

It is conventional that with the digital radio transmission method referred to as DAB (Digital Audio Broadcasting), source decoding includes error detection and correction, dequantization and filtering of data. In a related art channel coding, error detecting and correcting codes are used, whereas a checksum (cyclic redundancy check=CRC) is used in decoding the digital audio data, and when an error is detected, the data containing the error is replaced by equivalent preceding data.

U.S. patent application Ser. No. 5,450,081 describes error concealment in the time range on the analog audio signal. European Patent Application No. 0 718 982 describes error concealment in general with equalization of audio data by frames. Patent Abstracts of Japan JP 5328290 describes error concealment by interpolation when a count is reached or exceeded. DAB and various error concealment techniques are described by D. Wiese in "Optimization of Error Detection and Concealment for ISO/MPEG/AUDIO CODECs Layer I and II," 93$^{rd}$ AES Convention, no. 3368, 1992, pages 1–18. For example, replacement of corrupted scale factors by scale factors previously received correctly is mentioned. Another method describes filtering of high frequencies, because the interference there is localized to an especially great extent.

SUMMARY

The method according to the present invention for decoding digital audio data may provide the advantage that spectral shaping of audio signals is performed during dequantization as a function of an error number determined by using the checksum. Errors that occur are compensated to advantage in this manner by using the error number to estimate how the audio spectrum must be altered to minimize the effects of these errors. Errors are concealed in this manner.

The method according to the present invention may have a low additional cost and may be implemented in any audio decoder. In particular the fact that the errors are concealed individually results in a gradual loss of quality which is not otherwise possible with digital data. This is pleasant for a listener, although a loss of quality would nevertheless be noticed.

It may be advantageous that the values are either loaded from a memory and/or calculated by a processor. This makes use of knowledge with which the stored equalizer values were originally determined, and on the other hand, the equalizer values may be adapted to the respective situation by a calculation, thus achieving an adaptive performance characteristic. The error correction is thus adapted optimally, so that the user of a radio receiver using the method according to the present invention will not notice a sudden decline in quality of the audio signals.

In addition, it may be advantageous that the measure of the quality of the digital audio data is compared with threshold values. This makes it possible to set corresponding equalizer values as a function of whether or not this measure is above preselected threshold values. This permits a simple adaptation to the respective error situation. The method according to the present invention is not used when this measure indicates a very low error number or freedom from errors, because no error correction is necessary. If this measure indicates an error number in excess of the largest threshold value, i.e., the error correction no longer offers a remedy, then a muting is activated. Thus an optimized error correction is offered to the user as a function of the error number.

Example embodiments of the present invention are illustrated in the drawing and explained in greater detail in the following description.

DETAILED DESCRIPTION

Figure 1:
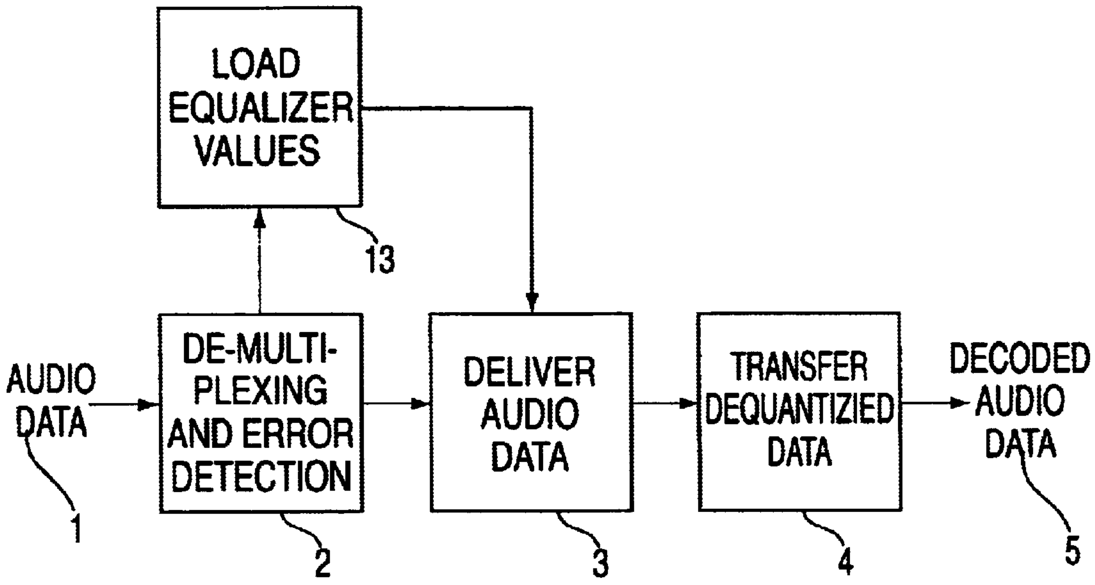
FIG. 1 illustrates a block diagram of the method according to the present invention.

If poor reception conditions occur in digital radio transmission methods such as DAB, so that it is no longer possible to correct errors occurring in the digital audio data, the audio quality suddenly becomes very poor, because a smooth transition from a very good quality to a very poor quality, like that in analog radio transmission methods, is impossible here. If an error that is not to be corrected occurs in digital audio data and if this error is made audible, the listener does not receive an audio impression corresponding to that of the digital transmission method; such an audio impression is very definitely present with analog audio signals, where at least fragments of the correct audio signals are still audible even in the case of very poor reception. In digital transmission methods, however, CD quality is expected in acoustic playback.

DAB is a digital radio transmission method suitable for mobile reception because a distribution of the data to be transmitted among multiple frequency carriers makes DAB robust with respect to frequency-selective damping, because in such a case only a very small percentage of the data transmitted suffers from frequency-selective damping. In addition, with its frame structure, DAB offers a convenient option for transmission of multimedia data. DVB (Digital Video Broadcasting) and DRM (Digital Radio Mondial) are methods similar to DAB that differ from it with regard to transmission rate, transmission frequencies and frame structure.

If these poor reception conditions are of brief duration, the error correction implemented by channel coding is capable of correcting the resulting errors. Channel coding performed at the transmission end adds redundancy back to data reduced by an irrelevancy by source coding; this redundancy is used in the receiver during channel decoding to detect and correct errors in audio data. The original state is reconstructed from the redundancy by calculation for the received data if not too much data is affected by error. Such error correcting codes as those used here include block codes and convolution codes.

Another type of error detection, which is implemented in the source decoding and works by using a checksum, forms a second step for detecting and correcting errors. When an error is detected here, previously stored data is used to replace the given data containing errors. Therefore, this is an arrangement for concealment of errors, but since there is a close correlation in chronologically successive audio data, this is a good estimate for replacing data currently containing errors.

Thus, if there is error detection for a frame by which audio data is transmitted, and if this frame is recognized as faulty, then the preceding frame, for example, is used to replace this faulty frame if the preceding frame is error-free. If this is not the case, a muting is activated. If such poor reception conditions occur for a longer period, then it is highly probable that switching back and forth between the muting and the audio data will result in an extremely disturbing effect.

In DAB (Digital Audio Broadcasting), audio signals are divided into frequency ranges at the transmission end. For each frequency range, the frequency value having the highest signal power is used as the reference value, referred to as the scale factor in DAB. The other signal values in this frequency range are normalized to this reference value. The distance from the lowest signal power to the highest signal power is thus greatly reduced. The reference values are then transmitted to the receiver with the normalized audio data.

If the chronological sequence of reference values within one frame is the same or very similar, then only one reference value is transmitted for this frequency range to save on transmission capacity. In DAB, 36 chronologically successive samples are taken for one frequency range (subband) and divided into three groups of twelve sampling values each. A reference value is defined for each group. If two or even all three reference values are the same or at least very similar, only one reference value is transmitted in each case. A notation is made in the DAB frame to indicate for which groups of sampling values a reference value is applicable.

In the receiver, error detection is performed by checksum (cyclic redundancy check=CRC) for each frame and also for the reference values. Error detection for the reference values is used for the method according to the present invention, i.e., the error number obtained for the reference values determines which measure will be taken in the method according to the present invention.

According to the present invention, the error number determined in the case of the reference values is compared with threshold values. The threshold value exceeded by the given error number determines which action is implemented.

FIG. 1 illustrates a block diagram of the decoding according to the present invention. The method illustrated here runs on a processor, which is the audio decoder.

Encoded audio data 1 is subjected to demultiplexing and error detection for reference values in a block 2. In DAB, data from various radio broadcast programs in one data stream is combined to a multiplex. Then in the receiver the data belonging to the radio program set is filtered out of the data stream by demultiplexing to decode this data so that it may be presented.

Over a first output, block 2 delivers data regarding the errors detected to a block 13, namely the number of errors detected. On the basis of this information, a set of equalizer values is loaded in block 13 from a memory connected to the audio decoder. Various sets of equalizer values linked to a respective error number are stored in the memory. Then on the basis of this error number, the corresponding set of equalizer values is selected and loaded.

As an alternative, the equalizer values may also be calculated by using a selected equation. In addition, a set of equalizer values may be loaded from the memory to then calculate new sets of equalizer values on the basis of these equalizer values.

Block 2 delivers the digital audio data to a block 3 over a second output, and dequantization of this digital audio data is performed in block 3 using the selected equalizer coefficients. Block 13 is therefore connected to a second input of block 3 over an output to deliver the equalizer values to block 3.

Individual subbands are greatly attenuated by the equalizer values, so that there is band limiting. Since errors in higher subbands have a greater interfering effect than errors in the lower subbands, the bandwidth of the audio signal represented is increasingly reduced, with an increasing number of errors, which is detected incrementally with a corresponding number of threshold values with which the error number is compared, until the error number is so high that a muting is necessary. The error distribution in higher and lower subbands is more or less the same, but errors in the higher subbands have a much greater effect on the audio impression.

Dequantized data is then transferred from block 3 to block 4, which filters the dequantized data. Then at the output of block 4, decoded audio data is ready for further processing.

The entire method is implemented on a processor which performs audio decoding in a radio receiver.

Figure 2:
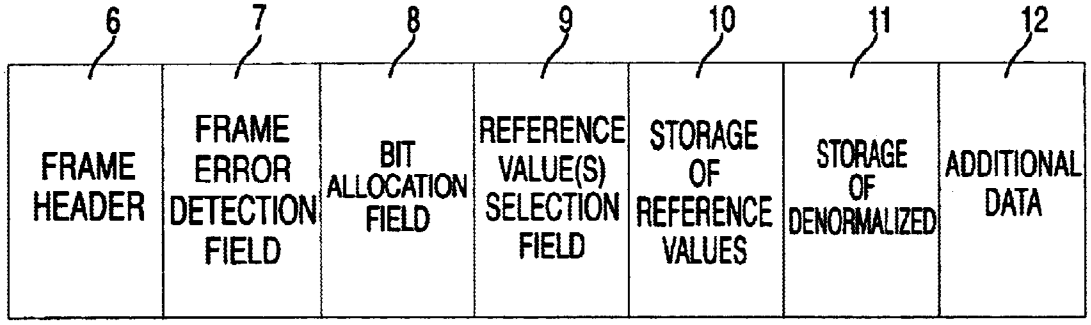
FIG. 2 illustrates an MPEG-1 layer II frame.

FIG. 2 illustrates an MPEG1 layer II frame. This frame structure is used for transmission in DAB.

The MPEG-1 layer II frame begins with a frame header 6, followed by a field 7 for frame error detection. A checksum known as a cyclic redundancy check is used here. If a faulty frame is detected on the basis of this CRC, then the last frame received correctly replaces the frame found to contain errors, or a muting is implemented for this frame. The CRC is configured here so that not all possible errors are detected. This saves greatly on transmission bandwidth if not all errors are detected. The test of a bit sum is characteristic of the CRC, but there is no consideration of the content of the audio data, as is the case with the method according to the present invention.

Then there follows a field for a bit allocation 8. In DAB, as well as other digital transmission and recording methods, the audio signals are quantized. A nonlinear quantization is performed on the basis of a psychoacoustic quantization curve. Noise in the proximity of a tone projecting out of the sound spectrum with respect to the frequency is no longer perceived by the ear. This is known as the hearing threshold. This makes it possible to reduce the data rate by removing noise below the hearing threshold from the data. The various subbands are also quantized with different degrees of fineness, the quantization fineness being determined by the fact that the quantization noise is below the hearing threshold. As a result of this difference in quantization per subband, different numbers of bits are to be allocated per subband. For example, the bit allocation per subband is between 3 and 16 bits.

In next field 9, a reference value selection is made. It is quite possible for reference values to be applicable to several groups of successive sampling values, the reference values having the same or at least very similar signal power values. This was already explained above. Therefore, it is not necessary to transmit multiple reference values for each subband if one reference value represents several groups. This field 9 now describes which reference values are to be used for which groups of sampling values for denormalization.

Then the reference values themselves are stored in field 10. The actual audio data denormalized with the reference values is stored in field 11. Field 12 contains additional data, including information accompanying the program and the CRC for the reference values of the following frame.

As an alternative, a counter may be incremented for each error in a frame and decremented for each error-free frame as a measure of the transmission quality. If this counter is compared with threshold values, it is possible to estimate whether only short-term interference is occurring or whether it is occurring more frequently. Thus a memory function is implemented, taking into account the history of the error frequency over time. If interference occurs for a short period, then a low error count is determined on the basis of the counter, and error concealment measures may be omitted. The method may thus have advantageous inertia and does not implement error concealment measures on the basis of isolated errors. However, if the counter is incremented steadily, error concealment measures must be used, and in the extreme case, a muting must also be used because the error rate becomes too great to conceal the errors appropriately. If error concealment methods are used, the equalizer values described above are determined to dampen higher subbands.

As an alternative, it is also possible to use two counters which are reset again after optimum reception.

Reference values may also be combined into groups, and if an error is detected in a reference value, the entire group is replaced by stored reference values. This may result in cost savings.

What is claimed is:

1. A method of decoding digital audio data, comprising the steps of:

performing an error detection of the digital audio data;

performing a dequantization the digital audio data;

filtering the digital audio data;

determining a measure of a transmission quality of the digital audio data on the basis of the error detection; and determining equalizer values as a function of the measure of the transmission quality, wherein the equalizer values are used to perform a spectral shaping of the audio data during the dequantization.

2. The method according to claim 1, wherein the determined equalizer values are retrieved from a memory.

3. The method according to claim 2, wherein the measure of transmission quality is compared with preselected threshold values, and wherein the equalizer values are determined as a function of threshold values which are exceeded by the measure.

4. The method according to claim 3, wherein if the measure of the transmission quality is less than a lowest threshold value, no equalizer values are used for dequantization.

5. The method according to claim 4, wherein if the measure is greater than a highest threshold value, a muting is implemented.

6. The method according to claim 1, wherein the equalizer values are computed.

7. The method according to claim 6, wherein the measure of transmission quality is compared with preselected threshold values, and wherein the equalizer values are determined as a function of threshold values which are exceeded by the measure.

8. The method according to claim 7, wherein if the measure of the transmission quality is less than a lowest threshold value, no equalizer values are used for dequantization.

9. The method according to claim 8, wherein if the measure is greater than a highest threshold value, a muting is implemented.

10. The method according to claim 8, wherein one error detection is performed per frame and per subband.

11. The method according to claim 1, wherein the digital audio data are divided into successive subbands, and the digital audio data are normalized for each subband.

12. The method according to claim 11, wherein the digital audio data are transmitted in frames.

13. The method of claim 1, wherein the equalizer values are calculated by a processor.

14. The method of claim 13, wherein the processor includes an audio decoder.

15. The method of claim 1, wherein the method is executed on a processor.

16. The method of claim 15, wherein the processor includes an audio decoder.

17. The method of claim 15, wherein the processor is arranged in a radio receiver.

18. The method of claim 1, wherein the equalizer values are calculated by using an equation.

* * * * *